(12) United States Patent
Chen

(10) Patent No.: US 12,196,862 B2
(45) Date of Patent: Jan. 14, 2025

(54) TRANSMISSION APPARATUS FOR LASER RADAR, LASER RADAR APPARATUS AND ELECTRONIC DEVICE

(71) Applicant: SHENZHEN GOODIX TECHNOLOGY CO., LTD., Shenzhen (CN)

(72) Inventor: Hua Chen, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 196 days.

(21) Appl. No.: 17/875,121

(22) Filed: Jul. 27, 2022

(65) Prior Publication Data

US 2023/0094857 A1    Mar. 30, 2023

Related U.S. Application Data

(63) Continuation of application No. PCT/CN2021/122396, filed on Sep. 30, 2021.

(51) Int. Cl.

| G01S 17/89 | (2020.01) |
|---|---|
| G01N 21/47 | (2006.01) |
| G02B 27/30 | (2006.01) |
| H01S 5/183 | (2006.01) |
| G05D 1/00 | (2006.01) |

(52) U.S. Cl.
CPC .............. *G01S 17/89* (2013.01); *G01N 21/47* (2013.01); *G02B 27/30* (2013.01); *H01S 5/183* (2013.01); *G05D 1/00* (2013.01)

(58) Field of Classification Search
CPC ........ G01S 17/89; G01N 21/47; G02B 27/30; H01S 5/183; G05D 1/00
See application file for complete search history.

(56) References Cited

U.S. PATENT DOCUMENTS

| 6,690,472 | B2 | 2/2004 | Kulp |
| 9,946,089 | B2 | 4/2018 | Chen |
| 10,353,215 | B2 | 7/2019 | Chen |
| 2002/0071122 | A1 | 6/2002 | Kulp |

(Continued)

FOREIGN PATENT DOCUMENTS

| CN | 105548989 A | 5/2016 |
| CN | 106443699 A | 2/2017 |

(Continued)

*Primary Examiner* — Tarifur R Chowdhury
*Assistant Examiner* — Kemaya Nguyen

(57) ABSTRACT

A transmission apparatus for laser radar, which includes: a light source including a light emitting array composed of M*N light emitting unit(s) configured for transmitting M*N beam(s) of light, where each row of the light emitting units of the light emitting array are arranged along a first direction, each column of the light emitting units of the light emitting array are arranged along a second direction; a collimating mirror configured for collimating the M*N beam(s) of light; a diffusion sheet including a first field of view in the first direction configured for converting the M*N beam(s) of light into M*N beam(s) of linear light with a first divergence angle in the first direction, and projecting the linear light to a target object to form N linear light spots parallel to the first direction, and the first field of view being equal to the first divergence angle.

18 Claims, 8 Drawing Sheets

(56) References Cited

U.S. PATENT DOCUMENTS

| | | | |
|---|---|---|---|
| 2014/0376092 A1* | 12/2014 | Mor | G01B 11/2513 359/569 |
| 2017/0115497 A1 | 4/2017 | Chen | |
| 2018/0203247 A1 | 7/2018 | Chen | |
| 2020/0088850 A1 | 3/2020 | Mheen | |
| 2020/0278426 A1* | 9/2020 | Dummer | H01S 5/04256 |
| 2022/0247158 A1* | 8/2022 | Gronenborn | G01B 11/2513 |

FOREIGN PATENT DOCUMENTS

| | | | | |
|---|---|---|---|---|
| CN | 206945971 U | | 1/2018 | |
| CN | 108051796 A | | 5/2018 | |
| CN | 108549085 A | | 9/2018 | |
| CN | 108604053 A | | 9/2018 | |
| CN | 108957911 A | | 12/2018 | |
| CN | 109324633 A | | 2/2019 | |
| CN | 109521639 A | | 3/2019 | |
| CN | 110463183 A | * | 11/2019 | G01B 11/14 |
| CN | 110658527 A | | 1/2020 | |
| CN | 110687541 A | | 1/2020 | |
| CN | 110726983 A | | 1/2020 | |
| CN | 110764073 A | * | 2/2020 | |
| CN | 111399245 A | | 7/2020 | |
| CN | 111722241 A | | 9/2020 | |
| CN | 112394363 A | | 2/2021 | |
| CN | 112433382 A | | 3/2021 | |
| CN | 112526534 A | | 3/2021 | |
| CN | 112914433 A | | 6/2021 | |
| CN | 113075642 A | | 7/2021 | |
| CN | 113311644 A | | 8/2021 | |
| WO | 2021083641 | | 5/2021 | |

\* cited by examiner

TRANSMISSION APPARATUS FOR LASER RADAR, LASER RADAR APPARATUS AND ELECTRONIC DEVICE

CROSS-REFERENCE TO RELATED APPLICATIONS

This application is a continuation of International Application No. PCT/CN2021/122396, filed on Sep. 30, 2021, the disclosure of which is hereby incorporated by reference in its entirety.

TECHNICAL FIELD

The present application relates to the field of laser radar technologies, and more specifically, to a transmission apparatus for laser radar, a laser radar apparatus and an electronic device.

BACKGROUND

A simultaneous localization and mapping (SLAM) technology is often used to solve a problem of localization and mapping of a mobile robot in an unknown environment, so it is widely used in sweeping robots, service robots, unmanned drone, autonomous vehicles and other devices, which all of them need to automatically implement real-time positioning, path planning, obstacle avoidance and other functions under a condition of unmanned operation. According to the type of sensor, SLAM may be divided into laser SLAM and visual SLAM, in which the laser SLAM is implemented by using laser radar, which may usually achieve very high measurement accuracy. The laser SLAM implements distance mapping based on a laser direct structuring (LDS) technology and performs intelligent obstacle avoidance by an additional sensor module. LDS measures a distance of a target object under different rotation angles in real time by a 360 degree high-speed rotating single beam laser. Limited by the number of lasers of the LDS and a measurement mode of a rotary ranging, the laser SLAM based on the LDS may only perform a two dimensional ranging, and a mechanical structure of a measurement module needs to protrude from the top of an electronic device to measure, which has problems of low reliability and short service life.

Therefore, it is necessary to provide a laser radar apparatus with simpler structure and higher measurement accuracy for the SLAM technology.

SUMMARY

Embodiments of the present application provide a transmission apparatus for laser radar, a laser radar apparatus and an electronic device, which have a simple structure and support measurement of three dimensional depth information while having high measurement accuracy.

In a first aspect, a transmission apparatus for laser radar is provided, including: a light source including a light emitting array composed of M*N light emitting unit(s) configured for transmitting M*N beam(s) of light, and M and N being positive integers, where each row of the light emitting units of the light emitting array are arranged along a first direction, each column of the light emitting units of the light emitting array are arranged along a second direction, and the first direction is perpendicular to the second direction; a collimating mirror configured for collimating the M*N beam(s) of light; a diffusion sheet including a first field of view in the first direction configured for converting the M*N beam(s) of light into M*N beam(s) of linear light with a first divergence angle in the first direction, and projecting the linear light to a target object to form N linear light spots parallel to the first direction, each of the linear light spots being formed by M beam(s) of the linear light, and the first field of view being equal to the first divergence angle.

In the embodiments of the present application, a transmission apparatus in a time-of-flight camera is specially designed, and a linear beam parallel to the first direction is obtained by using the diffusion sheet with the first field of view in the first direction, so that the transmission apparatus composed of the light source, the collimating mirror and the diffusion sheet has a simple structure and may perform high-precision laser radar mapping. On the one hand, the transmission apparatus utilizes the light source with the light emitting array, and the light emitted by the light emitting array forms a plurality of beams of linear beams after beam shaping by the collimating mirror and the diffusion sheet, so that the transmission apparatus may simultaneously emit a plurality of lines of laser to a target to be measured, and measure the three dimensional depth information, which improves measurement performance and measurement accuracy of the transmission apparatus, and the transmission apparatus is small in size, which is easy to be integrated into the device; on the other hand, the plurality of beams of the linear light emitted by the transmission apparatus have the first divergence angle in the first direction, the first divergence angle is equal to the first field of view of the diffusion sheet in the first direction, so that the transmission apparatus may measure the depth information of the target object in real time without rotating, avoiding use of a rotating mechanical structure and prolonging a service life of the transmission apparatus, and at the same time, since an optical field emitted by the transmission apparatus itself has the first field of view in the first direction, it is not necessary to rotate the light source to obtain the field of view in the first direction, so there is no need to install it on the top of a protruding device to avoid occlusion of the light source by the device, so that a sweeper may enter a low space. The plurality of beams of the linear light emitted by the transmission apparatus have the first divergence angle equal to the first field of view, and may also be used for obstacle detection and avoidance, so that the electronic device may support two functions of map construction and obstacle avoidance by using only one transmission apparatus, which is beneficial to miniaturization and thinning of the device while reducing the cost.

It should be understood that the first direction may be a horizontal direction or a vertical direction. The first field of view is typically greater than or equal to 60 degrees.

In a possible implementation manner, the transmission apparatus further includes: an optical replication element provided between the collimating mirror and the diffusion sheet configured for replicating the M*N beam(s) of light passing through the collimating mirror to obtain M*P*N*Q beam(s) of light, so that the diffusion sheet projects the M*P*N*Q beam(s) of light to the target object to form the N*Q linear light spot(s) parallel to the first direction, and each of the linear light spots is formed by M*P beam(s) of the linear light.

In the embodiments of the present application, by utilizing a replication capability of the optical replication element, the number of linear beams projected to a surface of the target to be measured may be increased without changing the light source, thereby expanding the field of view of the laser radar apparatus in the second direction, so that the laser radar apparatus has a wider detection range in the second direction, thereby improving a detection capability of the laser radar apparatus.

In a possible implementation manner, the collimating lens is a projection lens, the projection lens has a second field of view in the first direction and a third field of view in the second direction, so that a view field formed by the M*N beam(s) of the linear light converted by the diffusion sheet has the first field of view in the first direction, and the third field of view in the second direction.

In the embodiments of the present application, by using a projection lens with the larger field of view, the field of view of the laser radar apparatus in the second direction is larger, and a detection range of the laser radar apparatus in the second direction is expanded. When more light sources of the light emitting units are used, combined with a setting of the projection lens, the linear beam projected to the surface of the target to be measured not only has a larger field of view, but also has a larger number, thereby further improving detection accuracy of the laser radar apparatus.

In a possible implementation manner, the transmission apparatus further includes: the driving module connected with the light source configured for driving each row of the light emitting units of the light emitting array.

In the embodiments of the present application, the driving module drives the light source by partition, that is, each row of the light emitting units may be driven independently, so that the laser radar apparatus may select the number of rows and positions of the light emitting units to be lit according to application needs. Illustratively, when the laser radar apparatus is far away from the target to be measured, only one row of the light emitting units shall be lit. As the laser radar gradually approaches the target to be measured, more light emitting units shall be lit row by row, which may save power consumption and improve working efficiency of the laser radar apparatus when the laser radar apparatus is far away from the target to be measured and does not need to collect too much depth information in the second direction.

In a possible implementation manner, the driving module is configured for simultaneously driving k row(s) of the light emitting units in N row(s) of the light emitting units in a first period, 1≤k≤N.

In a possible implementation manner, the driving module is further configured for simultaneously driving (N−k) row(s) of the light emitting units in the N row(s) of the light emitting units in a second period.

It should be understood that the second period is a period after the end of the first period.

In the embodiments of the present application, the driving module drives the light source by time division and partition, so that the laser radar apparatus may light the light emitting units with different numbers of rows and positions in different periods, so as to switch back and forth between different lighting modes. Illustratively, when it is necessary to carry out a long range depth detection with low accuracy in the second direction, only one row of the light emitting units are lit to emit one linear beam; when it is necessary to carry out a close range depth detection with high accuracy in the second direction, the N−1 row(s) of the light emitting units are lit simultaneously. It should be understood that the N−1 row(s) of the light emitting units may include one row of the light emitting units that have been lit in the N rows of the light emitting units, or may be the remaining N−1 row(s) of the light emitting units except for the one row of the light emitting units that have been lit.

In a preferred implementation manner, the driving module is further configured for simultaneously driving the remaining (N−k) row(s) of the light emitting units in the N row(s) of the light emitting units in the second period. In a possible implementation manner, the transmission apparatus is applied to a sweeping robot.

When the transmission apparatus of the embodiments of the present application is applied to the sweeping robot, since the transmission apparatus does not need to protrude from the top of the device, the sweeping robot shall not be stuck or collided due to a height of the transmission apparatus when cleaning a position such as the bottom of a bed, resulting in failure or damage, which improves the working efficiency of the sweeping robot and prolongs the service life of the sweeping robot.

In a possible implementation manner, the light source is a vertical cavity surface emitting laser.

In a second aspect, a laser radar apparatus is provided, including: the transmission apparatus according to any possible implementation manner of the first aspect configured for projecting an optical signal to a target object; a receiving apparatus connected with the transmission apparatus configured for receiving a reflected optical signal returned by the target object, and analyzing the reflected optical signal to obtain depth information of the target object.

The laser radar apparatus in the embodiments of the present application uses a transmission apparatus in a special time-of-flight camera as a transmission apparatus of the laser radar, which has a simple structure and high measurement accuracy, does not need to be installed at a position protruding from the top of the device, and is convenient for an overall integration and assembly of the device.

In a possible implementation manner, the receiving apparatus includes: a receiving lens configured for receiving the reflected optical signal, a field of view of the receiving lens being equal to the first field of view; a sensor provided below the receiving lens configured for analyzing the reflected optical signal to obtain depth information of the target object.

In a possible implementation manner, the sensor is connected with the driving module configured for sending driving information to the driving module to enable the driving module to drive the light source.

In the embodiments of the present application, the transmission apparatus is controlled by the receiving apparatus, which is beneficial to synchronization of detection and sampling, avoids a situation that the laser radar apparatus cannot perform depth detection or detect errors due to asynchronous detection and sampling timing between the transmission apparatus and the receiving apparatus, and improves efficiency of the depth detection of the laser radar apparatus.

In a possible implementation manner, the sensor determines the driving information according to the depth information of the target object.

In a possible implementation manner, the receiving apparatus further includes: a filter provided above the sensor configured for transmitting the reflected optical signal with a preset wavelength.

In the embodiments of the present application, by setting the filter, an influence of the optical signal other than a signal light, such as an ambient light signal, on the depth detection may be filtered out, a signal-to-noise ratio may be increased, and accuracy of a depth information detection may be improved.

In a possible implementation manner, the receiving apparatus further includes: a supporting member configured for supporting the receiving lens to enable the sensor to be provided below the receiving lens.

In a third aspect, an electronic device is provided, including the laser radar apparatus in any one of the possible implementation manners of the second aspect.

In a fourth aspect, a method of depth detection is provided, including: sending driving information, the driving information configured for instructing a transmission apparatus to transmit an optical signal, the optical signal including M*N beam(s) of linear light, the M*N beam(s) of the linear light being projected to a target object to form N linear light spot(s) parallel to a first direction, each of the linear light spots being formed by M beam(s) of the linear light, and M and N being positive integers; receiving the reflected optical signal returned by the target object; and calculating depth information of the target object according to the reflected optical signal.

In a possible implementation manner, the sending the driving information includes: sending first driving information, the first driving information configured for instructing the transmission apparatus to drive each row of light emitting units of a light emitting array. In a possible implementation manner, the sending driving information includes: sending second driving information in a first period, the second driving information configured for instructing the transmission apparatus to simultaneously drive k row(s) of the light emitting units in N row(s) of the light emitting units in the first period, 1≤k≤N.

In a possible implementation manner, the sending driving information further: sending third driving information in a second period, the third driving information configured for instructing the transmission apparatus to simultaneously drive (N−k) rows of the light emitting units in the N row(s) of the light emitting units in the second period.

In the embodiments of the present application, by sending different driving information, the transmission apparatus is instructed to drive the light source by time division and partition, so that the laser radar apparatus may light the light emitting units with different numbers of rows and positions in different periods, so as to switch back and forth between different lighting modes. For example, when it is necessary to carry out a long range depth detection with low accuracy in the second direction, the second information is sent to instruct the transmission apparatus to light only three rows of the light emitting units and emit three linear beams; when it is necessary to carry out a close range depth detection with high accuracy in the second direction, the third information is sent to instruct the transmission apparatus to light N−3 row(s) of light emitting units simultaneously. It should be understood that the N−3 row(s) of the light emitting units may include three rows of the light emitting units that have been lit in the N rows of the light emitting units, or may be the remaining N−3 row(s) of the light emitting units except for the three rows of the light emitting units that have been lit.

In a preferred implementation manner, the third driving information is configured for indicating the transmission apparatus to simultaneously drive the remaining (N−k) row(s) of the light emitting units in the N row(s) of the light emitting units in the second period.

In a possible implementation manner, the method further includes: determining the driving information according to a use scenario of the transmission apparatus.

In the embodiments of the present application, the driving information is determined according to the use scenario of the transmission apparatus, that is, a distance between the transmission apparatus and the target object, and a lighting mode of the transmission apparatus may be flexibly indicated according to the current scenario of the transmission apparatus, thereby reducing power consumption of the transmission apparatus.

DESCRIPTION OF EMBODIMENTS

The technical solutions in embodiments of the present application shall be described hereinafter with reference to the accompanying drawings.

Figure 1:
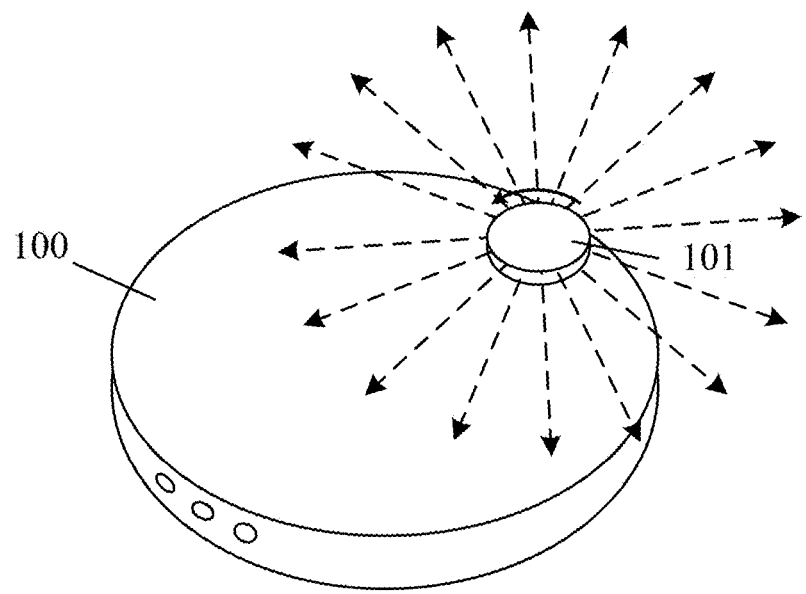
FIG. 1 is a schematic structural diagram of a laser radar apparatus.
Figure 2:
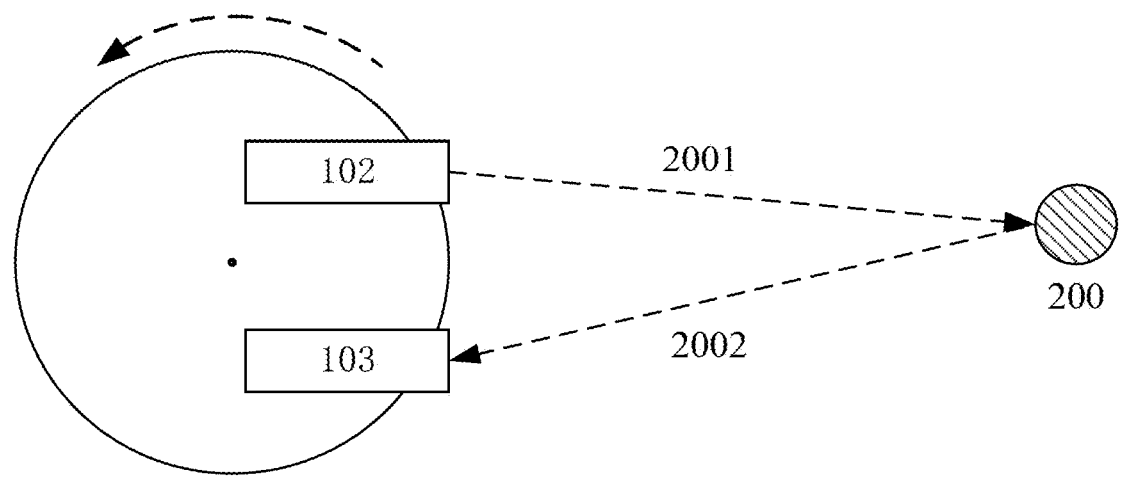
FIG. 2 is a schematic diagram of depth detection of a laser radar apparatus.

A laser radar apparatus is an important component to implement a simultaneous localization and mapping (SLAM) technology, which may measure depth information independently of an ambient light, so it has been widely used. Taking a sweeping robot as an example, FIGS. 1 and 2 show common laser radar apparatus and a principle of depth detection thereof. The embodiments of the present application use a sweeping robot as an example to explain a working principle and an effect of the laser radar apparatus. It should be understood that the laser radar apparatus described in the present application may also be applied to devices such as service robots, unmanned drones, and self-driving cars.

The top of a sweeping robot 100 is provided with a laser radar apparatus 101, the laser radar apparatus 101 may emit a beam of laser and rotate at the top of the sweeping robot. The laser radar apparatus 101 may be fixed relative to the sweeping robot 100, and rotate with rotation of the sweeping robot 100, or may also rotate relative to the sweeping robot 100 by itself. The laser radar apparatus usually includes a transmission apparatus for laser radar 102 and a receiving apparatus for laser radar 103. The transmission apparatus 102 is usually a laser direct structuring (LDS) module, which emits a single beam of linear laser outwards, and through continuous rotation of the laser radar apparatus, an optical signal 2001 emitted by the transmission apparatus 102 is reflected by a target object 200 to form a reflected optical signal 2002 carrying depth information, which is received by the receiving apparatus 103, and the sweeping robot 100 obtains the depth information of the target object by analyzing the reflected optical signal 2002. Combined with a motion trajectory of the sweeping robot 100 itself, an indoor two dimensional map may be constructed. Since the laser radar apparatus 101 detects the depth information by rotating, in order to avoid occlusion of the optical signal by the sweeping robot 100 itself, the laser radar apparatus 101 must protrude from the top of the sweeping robot 100, so that the sweeping robot 100 travels to a low position such as the bottom of a bed, the protruding laser radar apparatus 101 is easily stuck or collided, which affects normal travel and service life of the sweeping robot 100. In addition, the laser radar apparatus based on a rotating mechanical structure is limited by a rotational speed and a sampling rate of the mechanical structure, and a resolution of the laser radar apparatus is also limited. For example, a typical laser radar apparatus has a rotation speed of 360 rpm (i.e. 6 revolutions per second) and a sampling rate of 2080 Sa/s, and the calculated angular resolution thereof is only 1°.

Figure 3:
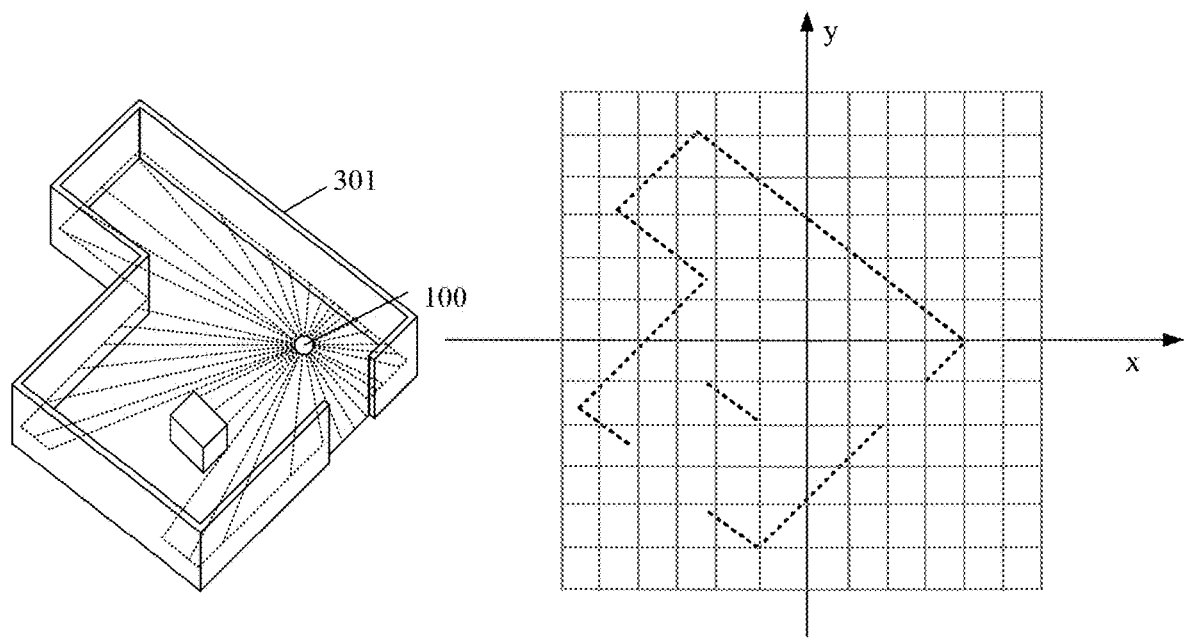
FIG. 3 is a scene diagram and an effect diagram of a two dimensional map construction of a sweeping robot according to the present application.

FIG. 3 shows a scene where the sweeping robot 100 constructs a two dimensional map by using the laser radar apparatus 101 in an indoor environment 300 with an obstacle 301 and a schematic effect diagram of the two dimensional map. It can be seen from FIG. 3 that the laser radar apparatus 101 may only obtain limited two dimensional depth information and the resolution is limited by the rotating mechanical structure thereof, and does not support more precise and accurate mapping or three dimensional obstacle avoidance. Therefore, the sweeping robot 100 usually needs to combine a three dimensional visual camera to obtain three dimensional depth information to support functions of mapping and obstacle avoidance of the three dimensional map. Three dimensional deep vision cameras are generally divided into time of flight (TOF) camera, structure light (SL) camera and binocular stereo camera according to different measurement principles. Among them, the time of flight camera adopts an active light detection method to obtain a distance of the target object by detecting a flight (round-trip) time of the optical signal. The time-of-flight camera is generally composed of light sources, optical components, sensors, control circuits, processing circuits and other units.

In addition, when the sweeping robot 100 includes a plurality of laser radar apparatuses 101, although they may simultaneously emit a plurality of beams of laser, the plurality of apparatuses need to protrude from the top of the sweeping robot 100 and avoid mutual occlusion between the plurality of laser radar apparatuses 101, so that a height of the plurality of laser radar apparatuses 101 protruding from the top of the sweeping robot 100 increases, which further increases a risk of collision between the sweeping robot 100 and environment.

In view of this, the present application provides a transmission apparatus for laser radar, a laser radar apparatus and an electronic apparatus, which have a simple structure and support measurement of three dimensional depth information while having high measurement accuracy, so that the electronic device may implement two functions of mapping and obstacle avoidance only by using the laser radar apparatus.

Figure 4:
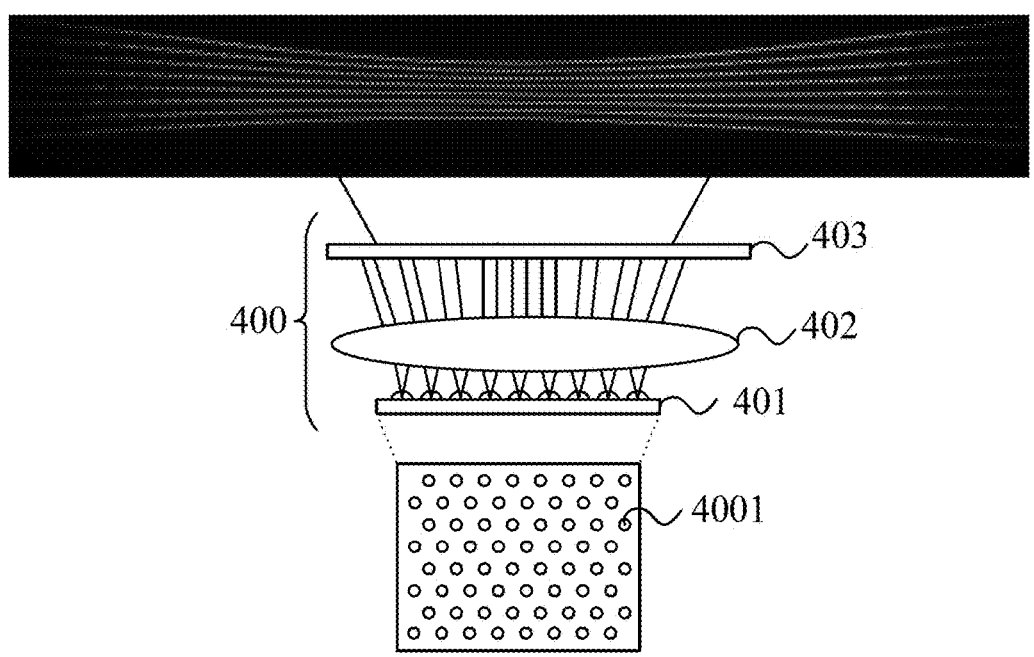
FIG. 4 is a schematic structural diagram of a transmission apparatus for laser radar according to the present application.

FIG. 4 is a schematic structural diagram of a transmission apparatus for laser radar according to the present application.

A transmission apparatus 400 includes: a light source 401, a collimating mirror 402 and a diffusion sheet 403. An optical signal emitted by the light source 401 is projected to a surface of an object to be measured after passing through the collimating mirror and the diffusion sheet.

The light source 401 includes a light emitting array composed of M*N light emitting unit(s) 4001 configured for transmitting M*N beam(s) of light, and M and N are positive integers, where each row of the light emitting units 4001 of the light emitting array are arranged along a first direction, each column of the light emitting units 4001 of the light emitting array are arranged along a second direction, and the first direction is perpendicular to the second direction.

The collimating mirror 402 is configured for collimating the M*N beam(s) of light emitted by the light source 401.

The diffusion sheet 403 has a first field of view in the first direction configured for converting the M*N beam(s) of light passing through the collimating mirror 402 into M*N beam(s) of linear light with a first divergence angle in the first direction, and projecting the linear light to a target object to form N linear light spot(s) parallel to the first direction, each of the linear light spots is formed by M beam(s) of the liner light, and the first field of view is equal to the first divergence angle.

It should be understood that the first direction may be a vertical direction or a horizontal direction, and each row of the light emitting array includes M light emitting unit(s) 4001, and each column includes N light emitting unit(s) 4001.

Figure 5:
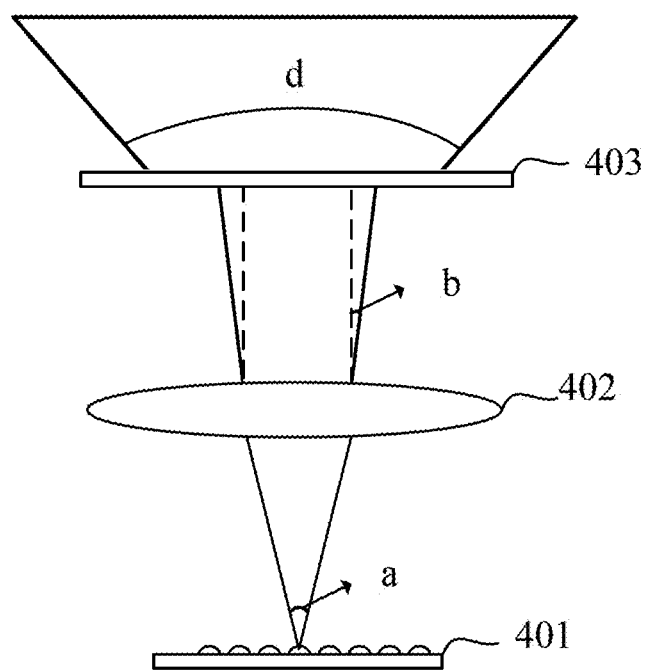
FIG. 5 is a beam shaping process diagram of a transmission apparatus for laser radar according to the present application.

FIG. 5 shows a beam shaping process of a transmission apparatus for laser radar according to the present application. Specifically, each light emitting unit 4001 emits a laser beam with a divergence angle a, and after being collimated by the collimating mirror 402, the laser beam is converted into the collimated laser beam, and the divergence angle of the laser beam shall be reduced to b at this time. The collimated laser beam passes through a diffusion sheet with a first field of view c in the first direction, and is shaped into a beam with a first divergence angle d in the first direction and the divergence angle b in the second direction, where the first field of view c is equal to the first divergence angle d. Since the first field of view c is much larger than the divergence angle (a or b) of the beam, the laser beam emitted by each light emitting unit 4001 is converted into the beam whose divergence angle in the first direction is much larger than the divergence angle in the second direction, and presents a linear light spot on a plane perpendicular to the beam, that is, the laser beam is converted into the linear beam.

Illustratively, the divergence angle of the laser beam emitted by the light source is 20°, that is, the divergence angle of the laser beam in the first direction and the second direction is both 20°, and the divergence angle of the beam after collimation by the collimating lens is 0.3°. After passing through a wide angle diffusion sheet with a 120° field of view in the first direction, the beam is shaped into a linear beam with a 120° divergence angle in the first direction and a 0.3° divergence angle in the second direction, and the linear light spot is formed on a surface of the target surface. Each of M*N beam(s) undergoes the above beam shaping process, and the light source(s) corresponding to the M light emitting unit(s) form one row of linear light spots in the first direction, so that the light source may project N row(s) of linear light parallel to the first direction to the target object.

Figure 6:
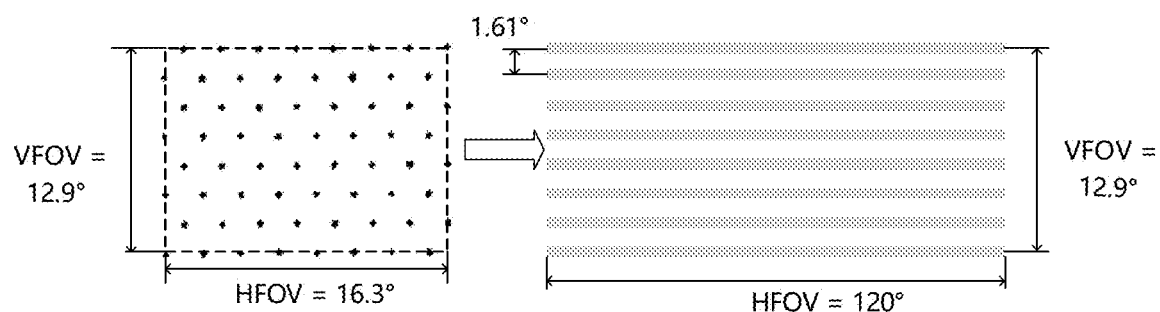
FIG. 6 is a schematic diagram of a light emitting array and a linear light spot of a transmission apparatus for laser radar according to the present application.

FIG. 6 is a schematic diagram of a light emitting array and a linear light spot of a laser radar apparatus according to the present application. As shown in FIG. 6, when the first direction is the horizontal direction, the second direction is the vertical direction, and the light source is an 8*8 light emitting array, the light source may emit 64 beams of light. A horizontal field of view (HFOV) and a vertical field of a view (VFOV) field formed by these 64 beams of light passing through the collimating mirror are 16.3° and 12.9°, respectively. If the field of view of the diffusion sheet is 120° in the horizontal direction, the 64 beams of light shall form a view field with a 120° horizontal field of view and a 12.9° vertical field of view, in which there shall be 8 linear light spots in the horizontal direction, and a linear resolution of the laser radar apparatus in the vertical direction, that is, an angular interval between each linear light spot in the vertical direction is 12.9°/8=1.61°.

Figure 7:
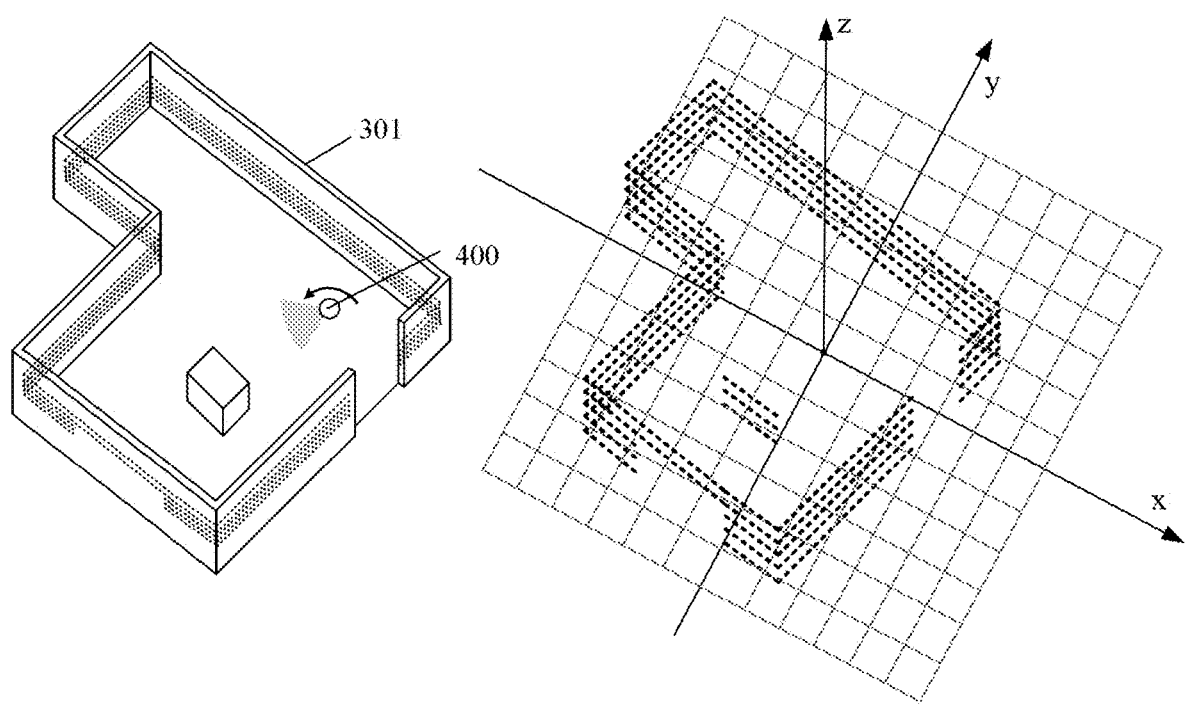
FIG. 7 is a scene diagram and an effect diagram constructed by a sweeping robot using a three dimensional map of a transmission apparatus for laser radar according to the present application.

FIG. 7 is a schematic effect diagram of a scene where a three dimensional map is constructed by a transmission apparatus for laser radar 400 in an indoor environment 300 with an obstacle 301 and the three dimensional map.

In the embodiments of the present application, the transmission apparatus in the time-of-flight camera is specially designed, and the linear beam parallel to the first direction is obtained by using the diffusion sheet with the first field of view in the first direction, so that the transmission apparatus composed of the light source, the collimating mirror and the diffusion sheet has the simple structure and may perform a high-precision laser radar mapping. On the one hand, the transmission apparatus utilizes the light source with the light emitting array, and the light emitted by the light emitting array forms a plurality of beams of linear beams after beam shaping by the collimating mirror and the diffusion sheet, so that the transmission apparatus may simultaneously emit a plurality of lines of laser to a target to be measured, and measure three dimensional depth information, which improves measurement performance and measurement accuracy of the transmission apparatus, and the transmission apparatus is small in size, which is easy to be integrated into the device; on the other hand, the plurality of beams of the linear light emitted by the transmission apparatus have the first divergence angle in the first direction, the first divergence angle is equal to the first field of view of the diffusion sheet in the first direction, so that the transmission apparatus may measure the depth information of the target object in real time without rotating, avoiding use of a rotating mechanical structure, and the transmission apparatus does not need to be installed on the top of a protruding device, which prolongs the service life of the transmission apparatus. The plurality of beams of the linear light emitted by the transmission apparatus have the first divergence angle equal to the first field of view, and may also be used for obstacle detection and avoidance, so that the electronic device may support two functions of map construction and obstacle avoidance by using only one transmission apparatus, which is beneficial to miniaturization and thinning of the device.

Optionally, the light source 401 is a vertical cavity surface emitting laser (VCSEL). VCSEL is a semiconductor diode laser. The emitted laser beam generally leaves the device from a top surface and in a substantially vertical manner. A VCSEL light source has many advantages such as small size, high power, small beam divergence angle, and stable operation, so it is a first choice of a depth detection system light source, and the embodiments of the present application use the VCSEL as an example for description. Specifically, the light source may be a single chip multi-point light emitting VCSEL chip. A plurality of light emitting points are arranged in a two dimensional matrix, correspondingly emit a plurality of beams of laser signals to form a matrix laser signal array.

Optionally, the light source 401 is an edge emitting laser (EEL) or a light emitting diode (LED).

It should be understood that the light source 401 may be one type of light source, or may be a combination of the above plurality of light sources. The optical signal may be the optically modulated, processed or controlled optical signal carrying a spatial optical pattern, or optically modulated, processed or controlled sub area lighting optical signal, or optically modulated, processed or controlled periodic light optical signal, or a combination of the above optical signals. An optical axis of the light source 401 is located at a geometric center of a light emitting plane and is perpendicular to the light emitting plane.

Optionally, the collimating mirror 402 is a glass or a plastic lens or a combination of glass/plastic. The collimating mirror may change a beam diameter and a divergence angle of an optical signal emitted by the light source 401, so that the beam becomes a collimated parallel beam with more concentrated energy, and a small high density light spot is obtained. It should be understood that the collimating mirror 402 described in the embodiments of the present application may also be other single optical elements or a combination of a plurality of optical elements that may achieve a beam collimating effect.

Optionally, the collimating mirror 402 includes a plurality of lenses arranged back and forth along an optical axis direction, the plurality of lenses are used for collimating N beam(s) of light, and a light incident face of the lens closest to the light source 401 in the plurality of lenses is a light incident face of the collimating mirror 402, and a light emitting face of the lens farthest from the light source 401 in the plurality of lenses is used as a light emitting face of the collimating mirror 402.

Figure 8:
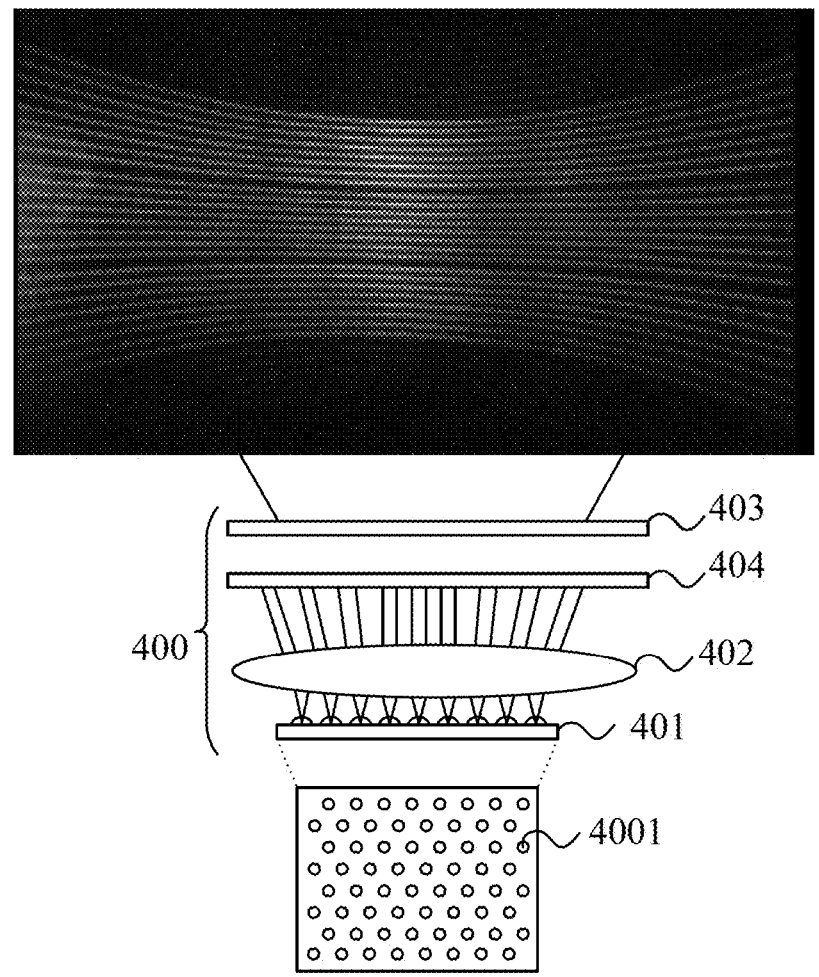
FIG. 8 is a schematic structural diagram of the other transmission apparatus for laser radar according to the present application.

FIG. 8 is a schematic structural diagram of the other transmission apparatus for laser radar according to the present application. Optionally, the transmission apparatus for laser radar 400 further includes:
an optical replication element 404 provided between the collimating mirror 402 and the diffusion sheet 403 configured for replicating the M*N beam(s) of light passing through the collimating mirror 402 to obtain M*P*N*Q beam(s) of light, so that the diffusion sheet 403 projects the M*P*N*Q beam(s) of light to the target object to form the N*Q linear light spots parallel to the first direction, and each of the linear light spots is formed by the M*P beam(s) of the linear light.

Specifically, P and Q are replication multiples of the optical replication element in the first direction and the second direction, respectively. The optical replication element may be at least one or a combination of various optical elements among the optical elements such as a diffractive optical element (DOE), a micro lens array (MLA), a grating, or the like. The embodiments of the present application take DOE as an example for description. The DOE is usually made of glass or plastic, and is used to replicate the beam emitted by the VCSEL light source at a certain multiple and then project it outward.

As an example but not a limitation, when the light source is an 8*8 light emitting array, it may emit 64 beams of light, and horizontal and vertical fields of view of a view field formed by the 64 beams of light after passing through the collimating lens are 16.3° and 12.9°, respectively. DOE has 3 times the replication capability in the first direction and the second direction, respectively, that is, the DOE's P=Q=3, the 64 beams of light are copied by the DOE to form 64*9=576 beams of light, a horizontal field of view of a view field formed by the 576 beams of light is 16.3° *3=48.9°, and a vertical field of view is 12.9° *3=38.7°. If a field of view of the diffusion sheet 403 in a horizontal direction is 120°, these 576 beams of light shall form a view field with a 120° horizontal field of view and a 38.7° vertical field of view after passing through the diffusion sheet 403.

In the embodiments of the present application, by utilizing the replication capability of an optical diffractive element, the number of linear beams projected to a surface of the target to be measured may be increased without changing the light source, thereby expanding the field of view of the laser radar apparatus in the second direction, so that the laser radar apparatus has a wider detection range in the second direction, thereby improving a detection capability of the laser radar apparatus.

Figure 9:
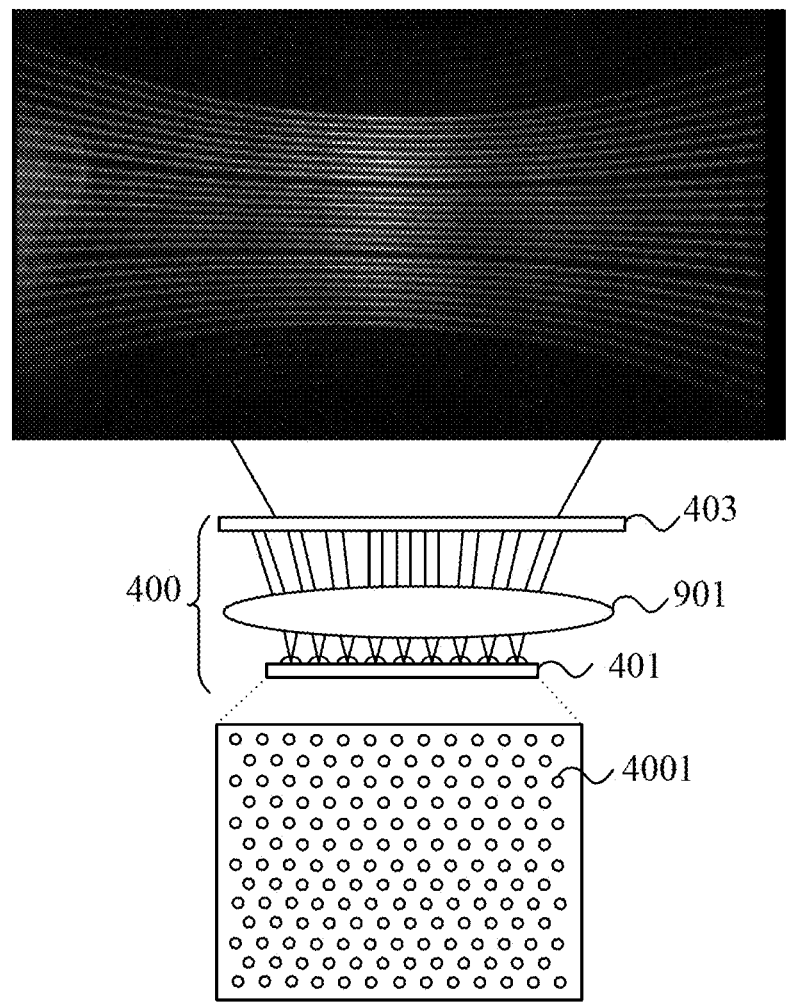
FIG. 9 is a schematic structural diagram of another transmission apparatus for laser radar according to the present application.

FIG. 9 is a schematic structural diagram of another transmission apparatus for laser radar according to the present application. Optionally, the collimating lens 402 is a projection lens 901, the projection lens 901 has a second field of view in the first direction and a third field of view in the second direction, so that a view field formed by the M*N beam(s) of the linear light converted by the diffusion sheet 403 in the first direction has the first field of view in the first direction, and the third field of view in the second direction.

Specifically, the projection lens 901 has a larger field of view and a shorter focal length than the collimating lens 401 in addition to a collimating capability. On the one hand, the field of view of the beam passing through the projection lens in the second direction is further increased, so that a detection range of the laser radar apparatus in the second direction is expanded; on the other hand, when using the projection lens 901, by increasing the number of light emitting arrays, it is possible to project more and denser beams to the diffusion sheet 403, so that the number of beams forming each row of the linear light spots increases, the number of rows of the linear light spots increases, and spacing between linear light plates also reduces, thereby improving a linear resolution of the laser radar apparatus in the second direction.

It should be understood that the projection lens 901 may also be used to replace the collimating mirror 402 in the laser radar apparatus including the optical replication element 404, which may further expand the detection range of the laser radar apparatus in the second direction.

Illustratively, the light source has 34*17 light emitting arrays and may emit 578 beams of light, a horizontal field of view of the view field formed after passing through the projection lens is 46.7°, and a vertical field of view is 60.2°. After the 578 beams of light pass through a diffusion sheet with a 120° horizontal field of view and undergo the beam shaping, a horizontal field of view of the formed light field is 120° and a vertical field of view is 60.2°, including 34 rows of horizontal light spots, each row of light spots is formed by 17 beams of horizontal line light, and a line resolution is 1.37° at this time.

In the embodiments of the present application, by using the projection lens with the larger field of view, the field of view of the laser radar apparatus in the second direction is larger, and the detection range of the laser radar apparatus in the second direction is expanded. When using the light source with more light emitting units, combined with a setting of the projection lens, the linear beam projected to the surface of the target to be measured not only has the larger field of view, but also has a larger number, thereby further improving detection accuracy of the laser radar apparatus.

Figure 10:
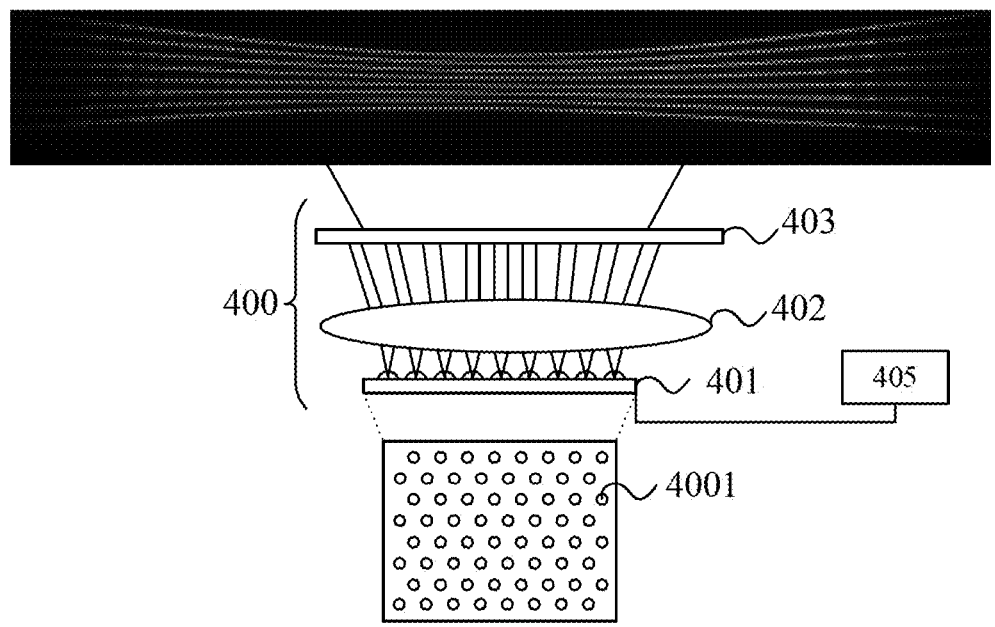
FIG. 10 is a schematic structural diagram of yet another transmission apparatus for laser radar according to the present application.

FIG. 10 is a schematic structural diagram of yet another transmission apparatus for laser radar according to the present application. Optionally, the transmission apparatus 400 further includes: the driving module 405 connected with the light source 401 configured for driving each row of the light emitting units of the light emitting array.

Specifically, each row of the light emitting array of the light source 401 may be driven independently, and when lighting only one row of the light emitting units, it corresponds to one linear light spot. The driving module 405 may determine the number and position of the lit rows according to requirements of a working scene of the laser radar apparatus.

In the embodiments of the present application, the driving module drives the light source by partition, that is, each row of the light emitting units may be driven independently, so that the laser radar apparatus may select the number of rows and positions of the light emitting units to be lit according to application needs. Illustratively, when the laser radar apparatus is far away from the target to be measured, only one row of the light emitting units shall be illustrated. As the laser radar gradually approaches the target to be measured, more light emitting units shall be lit row by row, which may save power consumption and improve working efficiency of the laser radar apparatus when the laser radar apparatus is far away from the target to be measured and does not need to collect too much depth information in the second direction.

Optionally the driving module is configured for simultaneously driving k row(s) of the light emitting units in N row(s) of the light emitting units in a first period, $1 \leq k \leq N$.

In a possible implementation manner, the driving module is further configured for simultaneously driving (N−k) row(s) of the light emitting units in the N row(s) of the light emitting units in a second period.

It should be understood that the second period is a period after the end of the first period.

Specifically, a first lighting mode is to light one row of the light emitting units or the light emitting units with a small number of rows. When a long distance and low precision depth detection in the second direction is required, for example, only indoor self-positioning or mapping is required, the drive module adopts the first lighting mode, only lights one row of the light emitting units and emit one linear beam; a second lighting mode is to simultaneously light a plurality of rows of the light emitting units. When a closer distance and high precision depth detection is required, for example, when obstacle avoidance is required, the driving module adopts the second lighting mode, and simultaneously lights the plurality of rows of the light emitting units to obtain the depth information in the first direction and the second direction. For another example, different lighting modes may be selected in different periods, and the above lighting modes may be switched and polled in sequence. The plurality of rows of the light emitting units lit in the second lighting mode may include the light emitting units that have been lit in the first lighting mode, or may be the light emitting units other than the light emitting units lit in the first lighting mode.

Optionally the driving module is configured for simultaneously driving the remaining (N−k) row(s) of the light emitting units in N row(s) of the light emitting units in the second period. For example, the light source includes eight rows of the light emitting units, the first, third, fifth, and seventh rows of the light emitting units are simultaneously driven in the first period, and the second, fourth, sixth, and eighth rows of the light emitting units are simultaneously driven in the second period.

In the embodiments of the present application, the driving module drives the light source by time division, so that the laser radar apparatus may light the light emitting units with different numbers of rows and positions in different periods, so as to switch back and forth between different lighting modes. While meeting requirements of three dimensional mapping, it may effectively save the power consumption of the laser radar apparatus.

Figure 11:
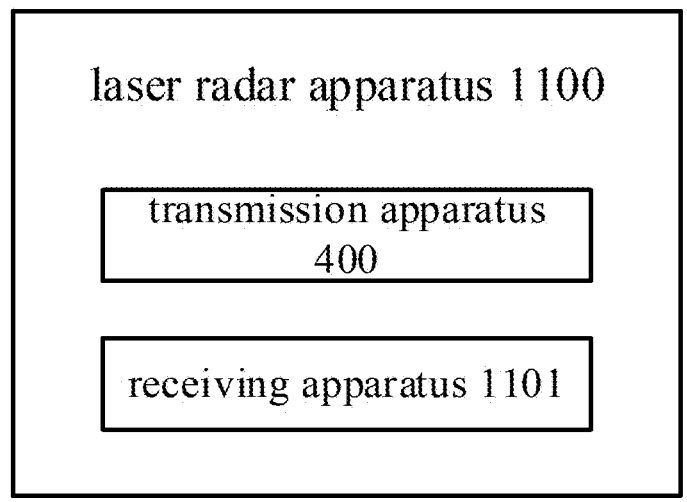
FIG. 11 is a schematic structural diagram of a laser radar apparatus according to the present application.

The embodiments of the present application further provide a laser radar apparatus. FIG. 11 is a schematic structural diagram of a laser radar apparatus of the present application. As shown in FIG. 11, a laser radar apparatus 1100 includes:
 a transmission apparatus 400 configured for projecting an optical signal to a target object;
 a receiving apparatus 1101 connected with the transmission apparatus 400 configured for receiving a reflected optical signal returned by the target object, and analyzing the reflected optical signal to obtain depth information of the target object.

Figure 12:
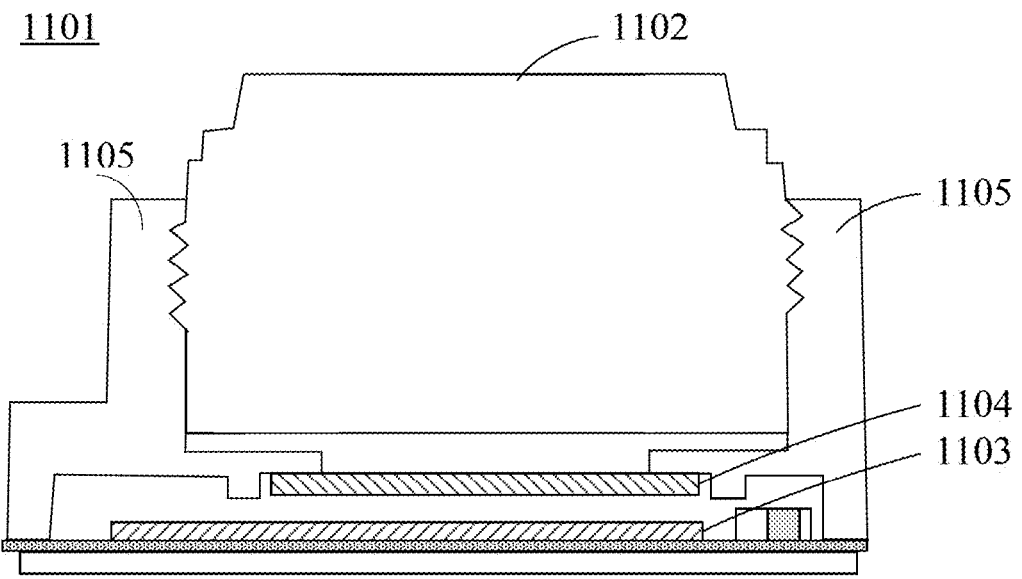
FIG. 12 is a schematic structural diagram of a receiving apparatus according to the present application.

Optionally, as shown in FIG. 12, the receiving apparatus 1101 includes:
 a receiving lens 1102 configured for receiving the reflected optical signal, and a field of view of the receiving lens 1102 is equal to the first field of view;
 a sensor 1103 provided below the receiving lens 1102 configured for analyzing the reflected optical signal to obtain depth information of the target object.

Specifically, the receiving lens 1102 may be an optical structure composed of a spherical surface or an aspherical surface, and is used to focus an incident light on the sensor 1103, and convert an optical signal collected by the lens into an electrical signal by the sensor 1103. The receiving lens 1102 may be composed of a combination of one or more lenses, and each lens may be made of resin and other materials by injection molding.

The laser radar apparatus in the embodiments uses a transmission apparatus in a special time-of-flight camera as a transmission apparatus of the laser radar, which has a simple structure and high measurement accuracy. The emitted light field itself has the first field of view in the first direction, it does not necessary to rotate the light source to obtain the field of view in the first direction, and it does not need to be installed at a position protruding from the top of the device to avoid the occlusion of the device to the light source, which is convenient for an overall integration and assembly of the device.

Optionally, the laser radar apparatus 1100 includes a plurality of transmission apparatuses 400, which may implement a 360° full angle depth information detection by providing them at different positions of the device and combining angles.

Optionally, the sensor 1103 is connected with the driving module 405 configured for sending driving information to the driving module 405 to enable the driving module to drive the light source 401.

In the embodiments, the transmission apparatus is controlled by the receiving apparatus, which is beneficial to synchronization of detection and sampling, avoids a situation that the laser radar apparatus cannot perform depth detection or detect errors due to asynchronous detection and sampling timing between the transmission apparatus and the receiving apparatus, and improves efficiency of the depth detection of the laser radar apparatus.

Optionally, the sensor 1103 determines the driving information according to the depth information of the target object.

Optionally, the receiving apparatus 1101 further includes:
 a filter 1104 provided above the sensor 1103 configured for transmitting the reflected optical signal with a preset wavelength.

In the embodiments, by setting the filter, an influence of the optical signal other than a signal light, such as an ambient light signal, on the depth detection may be filtered out, a signal-to-noise ratio may be increased, and accuracy of a depth information detection may be improved.

Optionally, the receiving apparatus 1101 further includes:
 a supporting member 1105 configured for supporting the receiving lens 1102 to enable the sensor 1103 to be provided below the receiving lens 1102.

Figure 13:
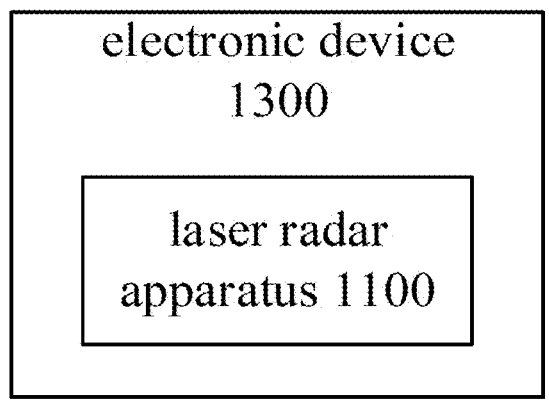
FIG. 13 is a schematic structural diagram of an electronic device according to the present application.

The embodiments of the present application further provide an electronic device 1300, as shown in FIG. 13, the electronic device 1300 includes: a laser radar apparatus 1100.

By way of example and not limitation, the electronic device in the embodiments of the present application may be portable or mobile computing devices such as terminal devices, mobile phones, tablet computers, notebook computers, desktop computers, gaming devices, in-vehicle electronic devices or wearable smart devices, and other electronic devices such as electronic databases, automobiles and automated teller machines (ATM). The wearable smart device is full-featured and large-sized and can realize complete or partial functions without relying on a smart phone, such as a smart watch or smart glasses, and only focuses on a certain type of application function, and shall be used in cooperation with such other device as a smart phone, such as various types of smart bracelets, smart jewelry and other devices for physical sign monitoring.

Figure 14:
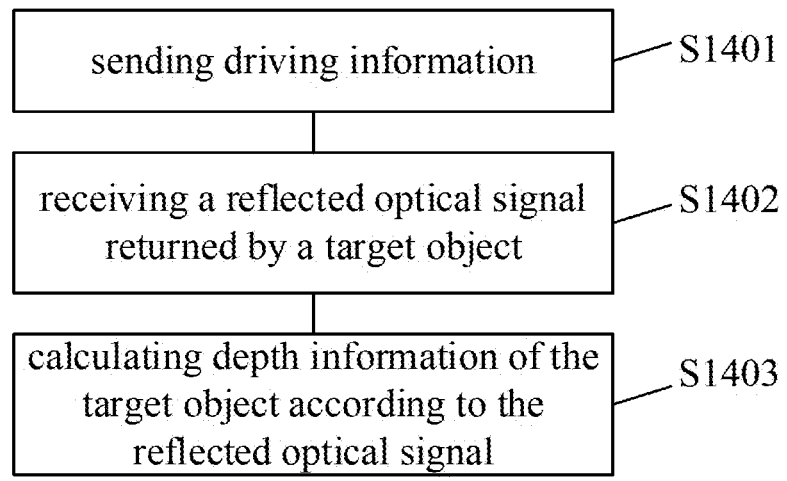
FIG. 14 is a schematic flowchart of a method of depth detection according to the present application.

As shown in FIG. 14, the embodiments of the present application further provide a method of depth detection, including:
 S1401: sending drive information;
 the driving information configured for instructing a transmission apparatus to transmit an optical signal, the optical signal including M*N beam(s) of linear light, the M*N beam(s) of the linear light being projected to a target object to form N linear light spot(s) parallel to a first direction, each of the linear light spots being formed by M beam(s) of the linear light, and M and N being positive integers;
 S1402: receiving the reflected optical signal returned by the target object;
 S1403: calculating depth information of the target object according to the reflected optical signal.

Optionally, in S1401, the sending driving information includes: sending first driving information, the first driving information configured for instructing the transmission apparatus to drive each row of light emitting units of a light emitting array. Optionally, in S1401, the sending driving information includes: sending second driving information in a first period, the second driving information configured for instructing the transmission apparatus to simultaneously drive k row(s) of the light emitting units in N row(s) of the light emitting units in the first period, 1≤k≤N.

Optionally, in S1301, the sending driving information further includes: sending third driving information in a second period, the third driving information configured for instructing the transmission apparatus to simultaneously drive (N−k) rows of the light emitting units in the N row(s) of the light emitting units in the second period.

In the embodiments, by sending different driving information at different periods, the transmission apparatus is instructed to drive the light source by time division and partition, so that the laser radar apparatus may light the light emitting units with different numbers of rows and positions in different periods, so as to switch back and forth between different lighting modes. For example, when it is necessary to carry out a long range depth detection with low accuracy in the second direction, the second information is sent to instruct the transmission apparatus to light only three rows of the light emitting units and emit one linear beam; when it is necessary to carry out a close range depth detection with high accuracy in the second direction, the third information is sent to simultaneously instruct the transmission apparatus to light N−3 row(s) of the light emitting units. It should be understood that the N−3 row(s) of the light emitting units may include three rows of the light emitting units that have been lit in the N rows of the light emitting units, or may be the remaining N−3 row(s) of the light emitting units except for the three rows of the light emitting units that have been lit in the first period.

Preferably, the third driving information is configured for indicating the transmission apparatus to simultaneously drive the remaining (N−k) row(s) of the light emitting units in the N row(s) of the light emitting units in the second period. That is, the (N−k) row(s) of the light emitting units other than the k row(s) of the light emitting units that have been lit in the first period.

In a possible implementation manner, the method further includes: determining the driving information according to a use scenario of the transmission apparatus.

The driving information is determined according to the use scenario of the transmission apparatus, that is, according to a distance between the transmission apparatus and the target object. For example, when the transmission apparatus is far away from the target, the first or second driving information is sent to drive the light emitting units with fewer rows, and when the transmission apparatus is closer to the target, the first or third driving information is sent to drive the light emitting units with more rows. In the embodiments, a lighting mode of the transmission apparatus may be flexibly indicated according to the current scenario of the transmission apparatus, thereby reducing the power consumption of the transmission apparatus.

It should be noted that, under a premise of no conflict, various embodiments and/or technical features in the various embodiments described in the present application may be combined with each other arbitrarily, and the technical solutions obtained after the combination should also fall within the protection scope of the present application.

It should be understood that terms used in embodiments of the present application and the claims appended hereto are merely for the purpose of describing particular embodiments, and are not intended to limit the embodiments of the present application. For example, the use of a singular form of "a", "the above" and "said" in the embodiments of the present application and the claims appended hereto are also intended to include a plural form, unless otherwise clearly indicated herein by context.

In the several embodiments provided in the present application, it should be understood that, the disclosed system and apparatus may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may be or may not be separated physically, and a component displayed as a unit may be or may not be a physical unit, namely, may be located in one place, or may be distributed on a plurality of network units. Part of or all of the units here may be selected according to a practical need to achieve the objectives of the solutions of the embodiments of the present application.

The foregoing descriptions are merely specific embodiments of the present application. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Therefore, the protection scope of the present application shall be subject to the protection scope of the claim.

What is claimed is:

1. A transmission apparatus for laser radar, applied to a sweeping robot, the transmission apparatus comprising:
a light source comprising a light emitting array composed of M*N light emitting unit(s) configured for transmitting M*N beam(s) of light and M and N being positive integers, wherein each row of the light emitting units of the light emitting array are arranged along a first direction, each column of the light emitting units of the light emitting array are arranged along a second direction, and the first direction is perpendicular to the second direction;
a collimating mirror configured for collimating the M*N beam(s) of light; and
a diffusion sheet comprising a first field of view in the first direction configured for converting the M*N beam(s) of light into M*N beam(s) of linear light with a first divergence angle in the first direction, and projecting the linear light to a target object to form N linear light spots parallel to the first direction, each of the linear light spots being formed by overlap of M beam(s) of the linear light, and the first field of view being equal to the first divergence angle,
wherein the collimating lens is a projection lens, the projection lens has a second field of view in the first direction and a third field of view in the second direction, so that a field of view formed by the M*N beam(s) of the linear light converted by the diffusion sheet has the first field of view in the first direction, and the third field of view in the second direction.

2. The transmission apparatus according to claim 1, wherein the transmission apparatus further comprises:
an optical replication element provided between the collimating mirror and the diffusion sheet configured for replicating the M*N beam(s) of light passing through the collimating mirror to obtain M*P*N*Q beam(s) of light, so that the diffusion sheet projects the M*P*N*Q beam(s) of light to the target object to form the N*Q linear light spot(s) parallel to the first direction, and each of the linear light spots is formed by M*P beam(s) of the linear light.

3. The transmission apparatus according to claim 1, wherein the transmission apparatus further comprises:
a driving module connected with the light source configured for driving each row of the light emitting units of the light emitting array.

4. The transmission apparatus according to claim 3, wherein the driving module is configured for simultaneously driving k row(s) of the light emitting units in N row(s) of the light emitting units in a first period, 1≤k≤N.

5. The transmission apparatus according to claim 4, wherein the driving module is further configured for simultaneously driving (N-k) row(s) of the light emitting units in the N row(s) of the light emitting units in a second period.

6. A method of depth detection, applied to a sweeping robot, the method of depth detection comprising:
sending driving information, the driving information configured for instructing the transmission apparatus according to claim 1 to transmit an optical signal, the optical signal including M*N beam(s) of linear light, the M*N beam(s) of the linear light being projected to a target object to form N linear light spot(s) parallel to a first direction, each of the linear light spots being formed by M beam(s) of the linear light, and M and N being positive integers;
receiving a reflected optical signal returned by the target object; and
calculating depth information of the target object according to the reflected optical signal.

7. The method according to claim 6, wherein the sending driving information comprises:
sending first driving information, the first driving information configured for instructing the transmission apparatus to drive each row of light emitting units of a light emitting array.

8. The method according to claim 6, wherein the sending driving information comprises:
sending second driving information in a first period, the second driving information configured for instructing the transmission apparatus to simultaneously drive k row(s) of the light emitting units in N row(s) of the light emitting units in the first period, 1≤k≤N.

9. The method according to claim 8, wherein the sending driving information further comprises:
sending third driving information in a second period, the third driving information configured for instructing the transmission apparatus to simultaneously drive (N-k) rows of the light emitting units in the N row(s) of the light emitting units in the second period.

10. The method according to claim 6, wherein the method further comprises: determining the driving information according to a use scenario of the transmission apparatus.

11. The transmission apparatus according to claim 1, wherein the first field of view is greater than or equal to 60 degrees.

12. A laser radar apparatus, applied to a sweeping robot, the laser radar apparatus comprising:
a transmission apparatus for laser radar, comprising: a light source comprising a light emitting array composed of M*N light emitting unit(s) configured for transmitting M*N beam(s) of light and M and N being positive integers, wherein each row of the light emitting units of the light emitting array are arranged along a first direction, each column of the light emitting units of the light emitting array are arranged along a second direction, and the first direction is perpendicular to the second direction; a collimating mirror configured for collimating the M*N beam(s) of light; a diffusion sheet comprising a first field of view in the first direction configured for converting the M*N beam(s) of light into M*N beam(s) of linear light with a first divergence angle in the first direction, and projecting the linear light to a target object to form N linear light spots parallel to the first direction, each of the linear light spots being formed by overlap of M beam(s) of the linear light, and the first field of view being equal to the first divergence angle;
wherein the transmission apparatus is configured for projecting an optical signal to a target object, the collimating lens is a projection lens, the projection lens has a second field of view in the first direction and a third field of view in the second direction, so that a field of view formed by the M*N beam(s) of the linear light converted by the diffusion sheet has the first field of view in the first direction, and the third field of view in the second direction;
a receiving apparatus connected with the transmission apparatus configured for receiving a reflected optical signal returned by the target object, and analyzing the reflected optical signal to obtain depth information of the target object.

13. The apparatus according to claim 12, wherein the receiving apparatus comprises:
a receiving lens configured for receiving the reflected optical signal, and a field of view of the receiving lens is equal to the first field of view;
a sensor provided below the receiving lens configured for analyzing the reflected optical signal to obtain the depth information of the target object.

14. The apparatus according to claim 13, wherein the transmission apparatus further comprises a driving module, the sensor is connected with the driving module configured for sending driving information to the driving module to enable the driving module to drive the light source.

15. The apparatus according to claim 13, wherein the sensor determines the driving information according to the depth information of the target object.

16. The apparatus according to claim 12, wherein the receiving apparatus further comprises:
a filter provided above the sensor configured for transmitting the reflected optical signal with a preset wavelength.

17. The apparatus according to claim 13, wherein the receiving apparatus further comprises:
a supporting member for supporting the receiving lens to enable the sensor to be provided below the receiving lens.

18. An electronic device, comprising the laser radar apparatus according to claim 12.

\* \* \* \* \*